United States Patent
Nakamoto

(10) Patent No.: US 8,049,651 B2
(45) Date of Patent: Nov. 1, 2011

(54) ΔΣ MODULATION CIRCUIT AND SYSTEM

(75) Inventor: Hiroyuki Nakamoto, Tokyo (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/686,973

(22) Filed: Jan. 13, 2010

(65) Prior Publication Data
US 2010/0214143 A1 Aug. 26, 2010

(30) Foreign Application Priority Data

Feb. 25, 2009 (JP) ................ 2009-042280

(51) Int. Cl.
*H03M 3/00* (2006.01)
(52) U.S. Cl. ........................ 341/143; 341/155
(58) Field of Classification Search .................. 341/143, 341/144, 118, 136, 155
See application file for complete search history.

(56) References Cited

U.S. PATENT DOCUMENTS

| | | | | |
|---|---|---|---|---|
| 5,870,048 | A * | 2/1999 | Kuo et al. | 341/143 |
| 7,061,415 | B2 * | 6/2006 | Magrath | 341/143 |
| 2002/0196169 | A1 | 12/2002 | Okuda et al. | |
| 2003/0196169 | A1 * | 10/2003 | Wittkotter et al. | 715/513 |

FOREIGN PATENT DOCUMENTS

| | | |
|---|---|---|
| JP | 07-015281 U | 3/1995 |
| JP | 2002-368620 A | 12/2002 |
| JP | 2004-080430 A | 3/2004 |
| JP | 2006-101531 A | 4/2006 |

* cited by examiner

*Primary Examiner* — Brian Young
(74) *Attorney, Agent, or Firm* — Arent Fox LLP

(57) ABSTRACT

A ΔΣ modulation circuit that includes a first integrator and second integrator coupled in series, a quantizer coupled to an output of the second integrator, a delay device disposed in a feedback path from an output of the quantizer to an input of the first and second integrators, an adder which generates a difference between an output and an input of the quantizer, and a feedback circuit including a delay device which couples an output of the adder to an output of one of the first and second integrators.

6 Claims, 12 Drawing Sheets

ΔΣ MODULATION CIRCUIT AND SYSTEM

CROSS-REFERENCE TO RELATED APPLICATIONS

This application claims the benefit of priority from Japanese Patent Application No. 2009-42280 filed on Feb. 25, 2009, the entire contents of which are incorporated herein by reference.

BACKGROUND

1. Field

Aspects of the embodiments discussed herein relate to a ΔΣ modulation circuit.

2. Description of Related Art

Related art is disclosed in Japanese Laid-open Patent Publication No. 2002-368620, Japanese Laid-open Patent Publication No. H7-15281, Japanese Laid-open Patent Publication No. 2006-101531, Japanese Laid-open Patent Publication No. 2004-80430, and the like.

SUMMARY

According to one aspect of the embodiments, a ΔΣ modulation circuit is provided which includes a first integrator and second integrator coupled in series, a quantizer coupled to an output of the second integrator, a delay device disposed in a feedback path from an output of the quantizer to an input of the first and second integrators, an adder which generates a difference between an output and an input of the quantizer, and a feedback circuit including a delay device which couples an output of the adder to an output of one of the first and second integrators.

Additional advantages and novel features of the invention will be set forth in part in the description that follows, and in part will become more apparent to those skilled in the art upon examination of the following or upon learning by practice of the invention.

DESCRIPTION OF EMBODIMENTS

Figure 1:
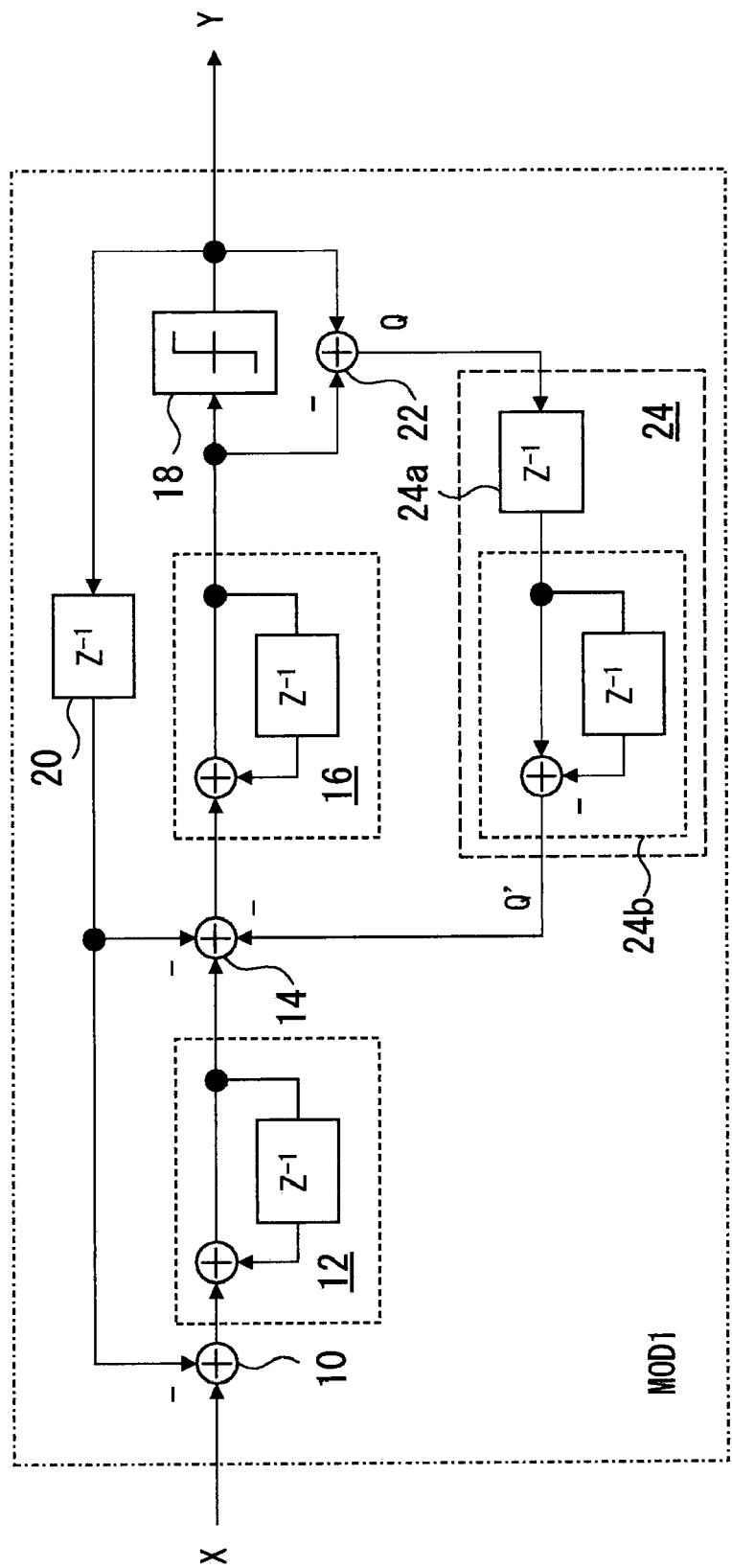
FIG. 1 illustrates a first embodiment.

A ΔΣ modulation circuit has a noise shaping characteristic. A high-order ΔΣ modulation circuit, for example, a ΔΣ modulation circuit with a large number of integrators, has a steep noise shaping characteristic and a high S/N ratio, where S represents the signal and N represents noise. The order of a ΔΣ modulator depends on a number of integrators. When there are two integrators, for example, ΔΣ modulator means second order. As integrators are increased, a noise shaping characteristic becomes a steep and good S/N ratio is obtained as a result.

When the ΔΣ modulation circuit is of a third order or higher, a phase of a feedback signal may rotate 180 degrees or more with respect to an input signal, and an output signal may be oscillated. In order to maintain the steep noise shaping characteristic of the third order or higher with stable operation, an oscillation prevention circuit, or an automatic restoration circuit which operates at an oscillation, may be necessary.

Around mark containing a "+" in the drawing indicates an adder. A "−" appended to an input of the adder indicates a subtraction. An input of the adder with no "−" indicates an addition. An integrator and a differentiator include an adder and a delay device ($Z^{-1}$).

FIG. 1 illustrates a first embodiment. A ΔΣ modulation circuit MOD1 illustrated in FIG. 1 includes an adder 10, integrator 12, adder 14, integrator 16, and quantizer 18 coupled in series, and a delay device 20, adder 22, and feedback circuit 24. An input signal X is input into the adder 10. An output signal Y is output from the quantizer 18. The delay device 20 receives the output signal Y, and feeds it back to each of the adders 10 and 14.

The adder 10 receives the input signal X and the output of the delay device 20, and outputs an addition result to the integrator 12. The adder 14 receives an output of the integrator 12, an output Q' of the feedback circuit 24, and the output of the delay device 20, and outputs an operation result to the integrator 16.

The adder 22 extracts a difference between an input and output of the quantizer 18 as a quantized noise Q. The feedback circuit 24 includes a delay device 24a and a differentiator 24b coupled in series. The feedback circuit 24 generates a feedback signal Q' from the quantized noise Q, and outputs it to the adder 14.

An input-output characteristic, for example, a signal transmission characteristic, of the integrators 12 and 16 is indicated by a Z function as "$1/(1-Z^{-1})$". An input-output characteristic of the differentiator 24b is indicated as "$1-Z^{-1}$". An input-output characteristic of the ΔΣ modulation circuit MOD1 illustrated in FIG. 1 is indicated by a Z function as equation 1.

$$Y(z) = ((X(z) - Y(z)Z^{-1})/(1-Z^{-1}) - Y(z)Z^{-1} - QZ^{-1}(1-Z^{-1}))/(1-Z^{-1}) + Q \quad\quad 1$$

In equation 1, "$X(z) - Y(z)Z^{-1}$" indicates an operation of the adder 10. "$-Y(z)Z^{-1}$" indicates a feedback operation from the delay device 20 to the adder 10 or adder 14. "$QZ^{-1}(1-Z^{-1})$" indicates an operation of the feedback circuit 24 (that is, Q').

By solving equation 1 for Y(z), equation 2 is obtained.

$$Y(z) = X(z) + Q(1-Z^{-1})^3 \quad\quad 2$$

where $(1-Z^{-1})^3$ means that the coefficient values grows based on a higher frequency and quantization noise Q is sifted to the higher frequency. It may be called a third-order noise shaping.

Equation 2 indicates that the ΔΣ modulation circuit MOD1, including two integrators, illustrated in FIG. 1 has a third-order shaping characteristic.

Figure 2:
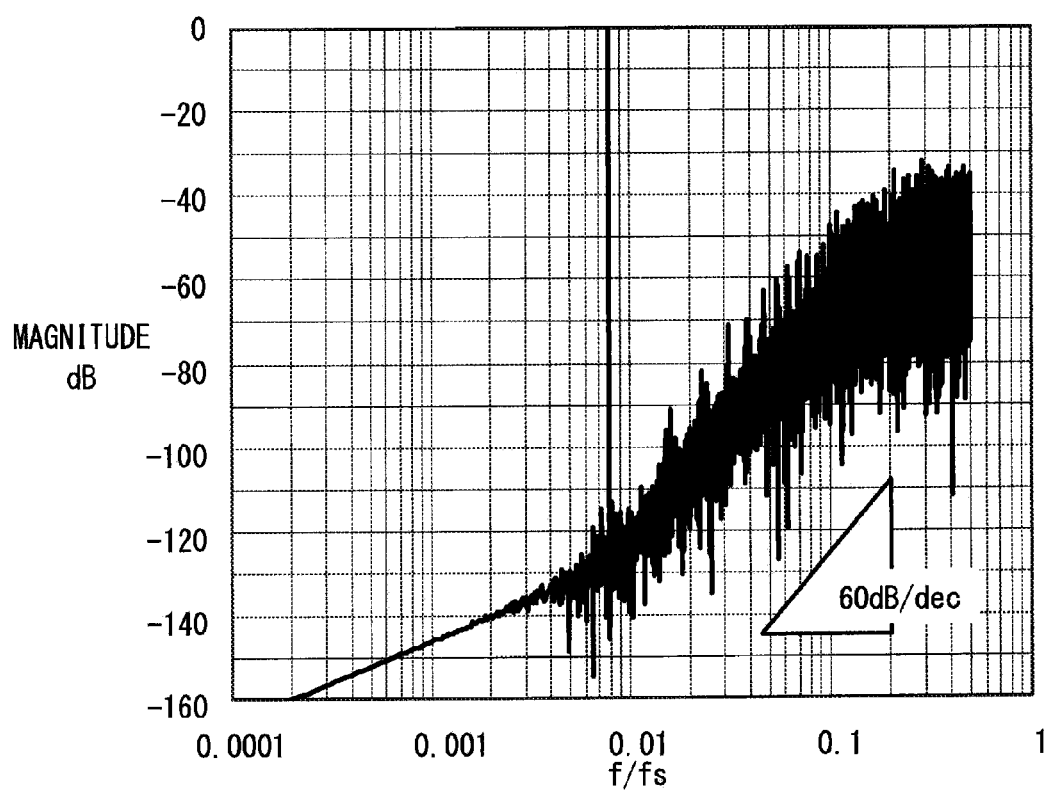
FIG. 2 illustrates an exemplary frequency characteristic simulation waveform.

FIG. 2 illustrates an exemplary frequency characteristic simulation waveform. The ΔΣ modulation circuit may be the ΔΣ modulation circuit MOD1 illustrated in FIG. 1. The vertical axis indicates a magnitude of an input signal, while the horizontal axis indicates a normalized frequency (input frequency f/sampling frequency fs). A noise component of the frequency characteristic illustrated in FIG. 2 has a slope of 60 dB/dec. A first-order ΔΣ modulator may have a slope of 20 dB/dec. Therefore, this simulation may indicate that the ΔΣ modulation circuit MOD1 illustrated in FIG. 1 has a third-order noise shaping characteristic.

Figure 3:
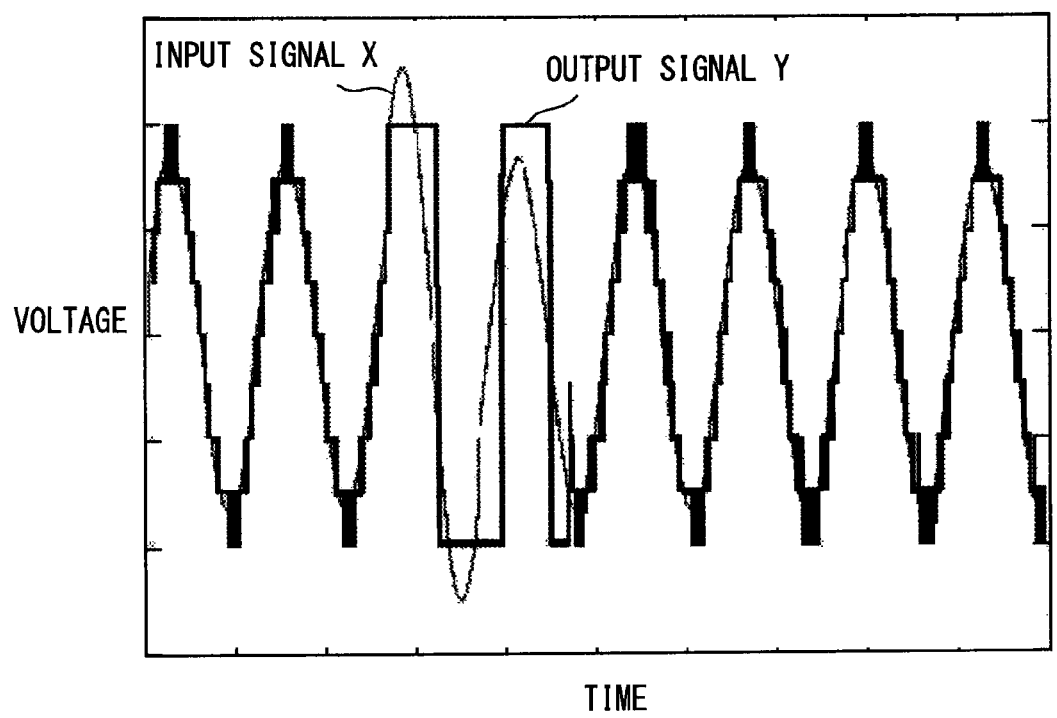
FIG. 3 illustrates an exemplary time response simulation waveform.

FIG. 3 illustrates an exemplary time response simulation waveform. The ΔΣ modulation circuit may be the ΔΣ modulation circuit MOD1 illustrated in FIG. 1. The vertical axis indicates a voltage magnitude of the input signal X and output signal Y, while the horizontal axis indicates a time. When an input signal X with an excessive or underestimate magnitude is applied to the ΔΣ modulation circuit MOD1, the output signal Y becomes to maximum or minimum value by quantizer 18 and may be temporarily set at a high level or a low level. In a higher-order, for example, more than three order ΔΣ modulator, a phase of a feedback signal may rotate 180 so that a feedback signal is reflected in an input. However, as the signal from the feedback circuit 24 is reflected in the adder 14, the ΔΣ modulation circuit MOD1 returns to a usual operation without oscillating, and outputs a normal output signal Y.

Figure 4:
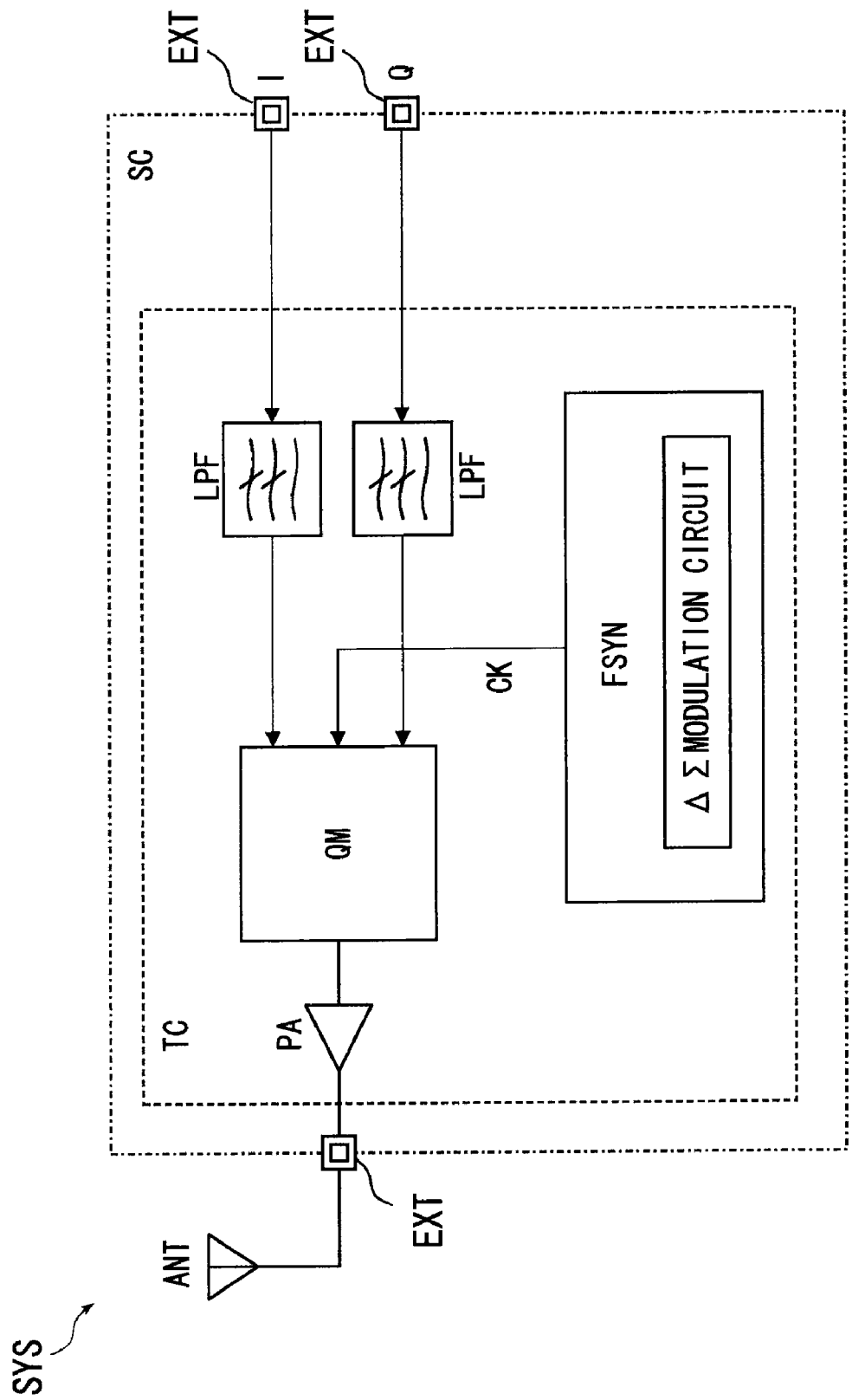
FIG. 4 illustrates an exemplary system including a ΔΣ modulation circuit.

FIG. 4 illustrates an exemplary system including a ΔΣ modulation circuit. The ΔΣ modulation circuit mounted in the system SYS illustrated in FIG. 4 may be the ΔΣ modulation circuit MOD1 illustrated in FIG. 1. The system SYS may be, for example, a portable terminal such as a mobile telephone. The system SYS includes a semiconductor chip SC including a transmission circuit TC, and an antenna ANT coupled to the semiconductor chip SC. EXT in the drawing indicates an external terminal of the semiconductor chip SC. The transmission circuit TC includes low pass filters LPF each of which receives one of an I component and a Q component, a quadrature modulator QM, a power amplifier PA, and a fractional synthesizer FSYN.

The transmission circuit TC quadrature-modulates the I component and Q component, which correspond to the transmission information, an analog signal, received via the low pass filters LPF, with the quadrature modulator QM, and generates a transmission signal. The power amplifier PA amplifies the transmission signal to a given transmission power, and outputs it to the antenna ANT. The synthesizer FSYN, including, for example, the ΔΣ modulation circuit MOD1 illustrated in FIG. 1, generates a clock CK necessary for a modulating operation of the quadrature modulator QM. The synthesizer FSYN includes one of ΔΣ modulation circuits MOD2, MOD3, MOD4, MOD5, and MOD6, to be described hereafter, in place of the ΔΣ modulation circuit MOD1.

As a fractional setting value which changes the frequency of the clock CK output from the synthesizer FSYN is ΔΣ modulated, in-band noise of the synthesizer FSYN is shaped at a high frequency, for example, out of band. As well as an operation of the synthesizer FSYN being stable, a steep noise shaping characteristic is realized by use of two integrators with third-order noise shaping.

Figure 5:
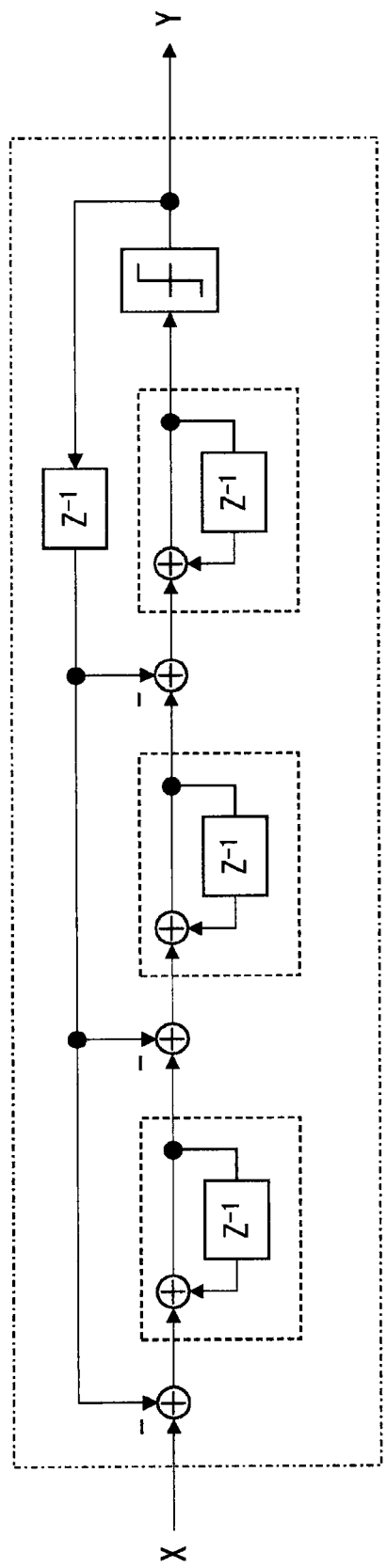
FIG. 5 illustrates an exemplary third-order ΔΣ modulation circuit.

FIG. 5 illustrates an exemplary third-order ΔΣ modulation circuit. The ΔΣ modulation circuit, including three integrators coupled in series, has a third-order noise shaping characteristic, in the same way as in equation 2.

Figure 6:
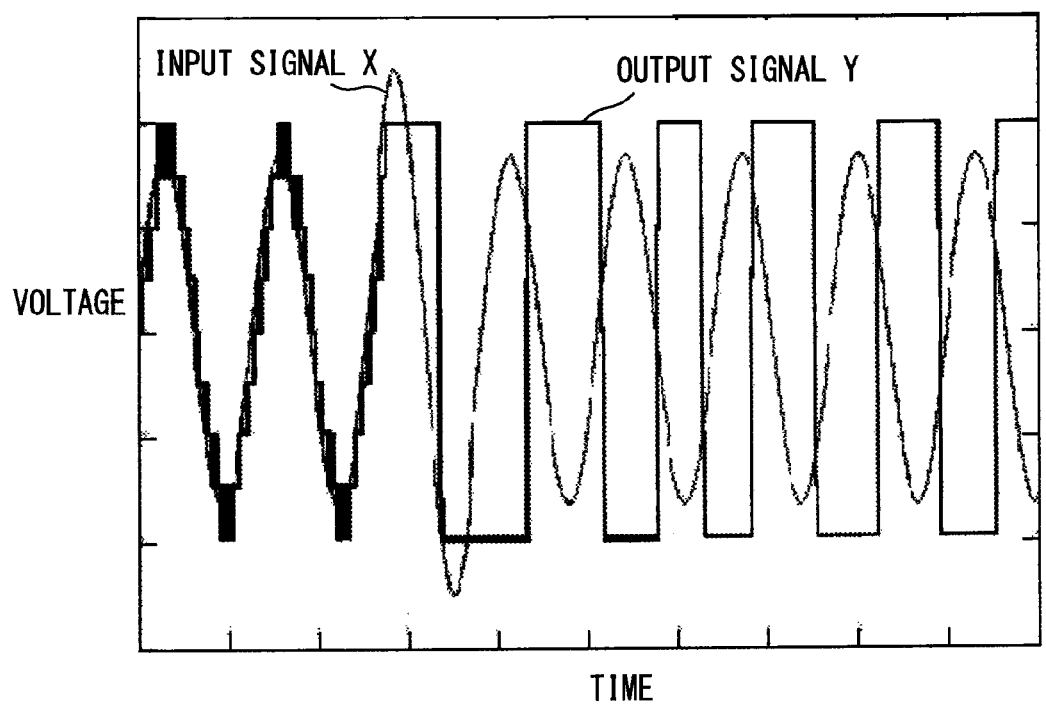
FIG. 6 illustrates an exemplary time response simulation waveform.

FIG. 6 illustrates an exemplary time response simulation waveform. The third order time response simulation waveform illustrated in FIG. 6 may be a time response simulation waveform of the third order ΔΣ modulation circuit illustrated in FIG. 5. When an input signal X with an excessive magnitude is applied to the ΔΣ modulation circuit, for example, a phase difference becomes 180 degrees or more, and the feedback to the adder which adds the input signals does not keep pace, whereby the output signal Y oscillates back and forth between a high level and a low level, as illustrated in FIG. 6. Unless a process of recovering from the oscillation is carried out, the ΔΣ modulation circuit may not carry out a usual operation.

Figure 7:
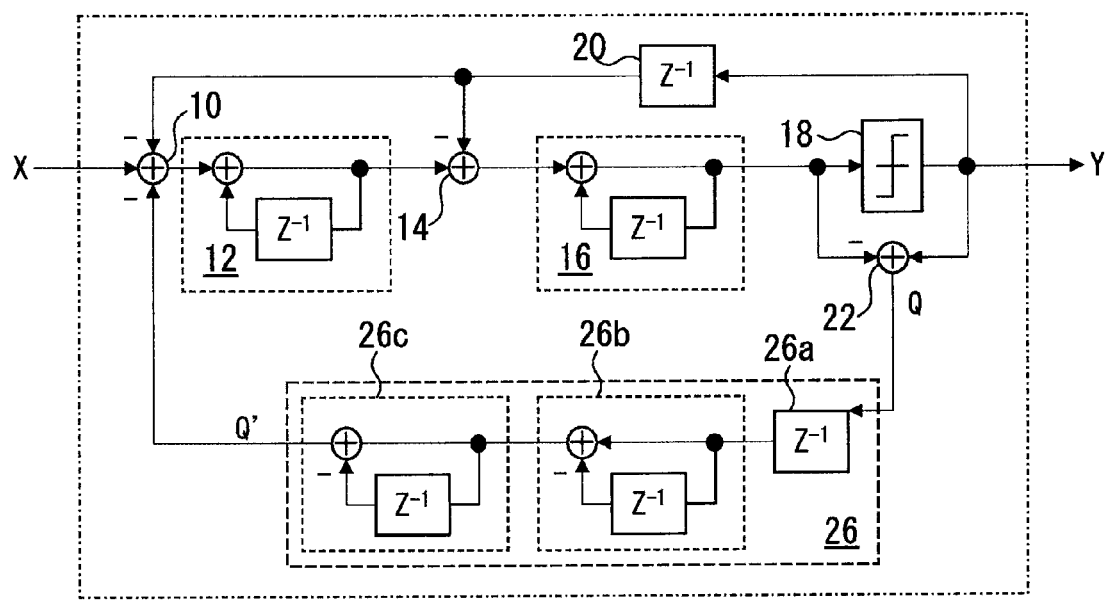
FIG. 7 illustrates an exemplary ΔΣ modulation circuit.

FIG. 7 illustrates an exemplary ΔΣ modulation circuit. The ΔΣ a modulation circuit illustrated in FIG. 7, including two integrators, has a third-order noise shaping characteristic. An output of a feedback circuit 26 is supplied to an adder 10, which corresponds to an input of an integrator 12. In order to realize the third-order noise shaping characteristic of the a modulation circuit, the feedback circuit 26 includes a delay device 26a, and two differentiators 26b and 26c, coupled in series. An input-output signal transmission characteristic of ΔΣ modulation circuit illustrated in FIG. 7 may be indicated by a Z function as equation 2. The feedback circuit and the output connection node of it illustrated in FIG. 7 are different from those illustrated in FIG. 1. The output of the feedback circuit 24 of the ΔΣ modulation circuit MOD1 illustrated in FIG. 1 is fed back to the output of the integrator 12. As the feedback circuit 24 includes the delay device 24a and differentiator 24b, the order of the feedback circuit 24, and the size of the ΔΣ modulation circuit, may become smaller than those illustrated in FIG. 7.

The previous ΔΣ modulation circuit includes two integrators and the small-sized feedback circuit 24. Since the size of the ΔΣ modulation circuit MOD1 may be downscaled, as well as the third-order noise shaping characteristic being obtained without oscillation, the cost and the power consumption may be reduced.

Figure 8:
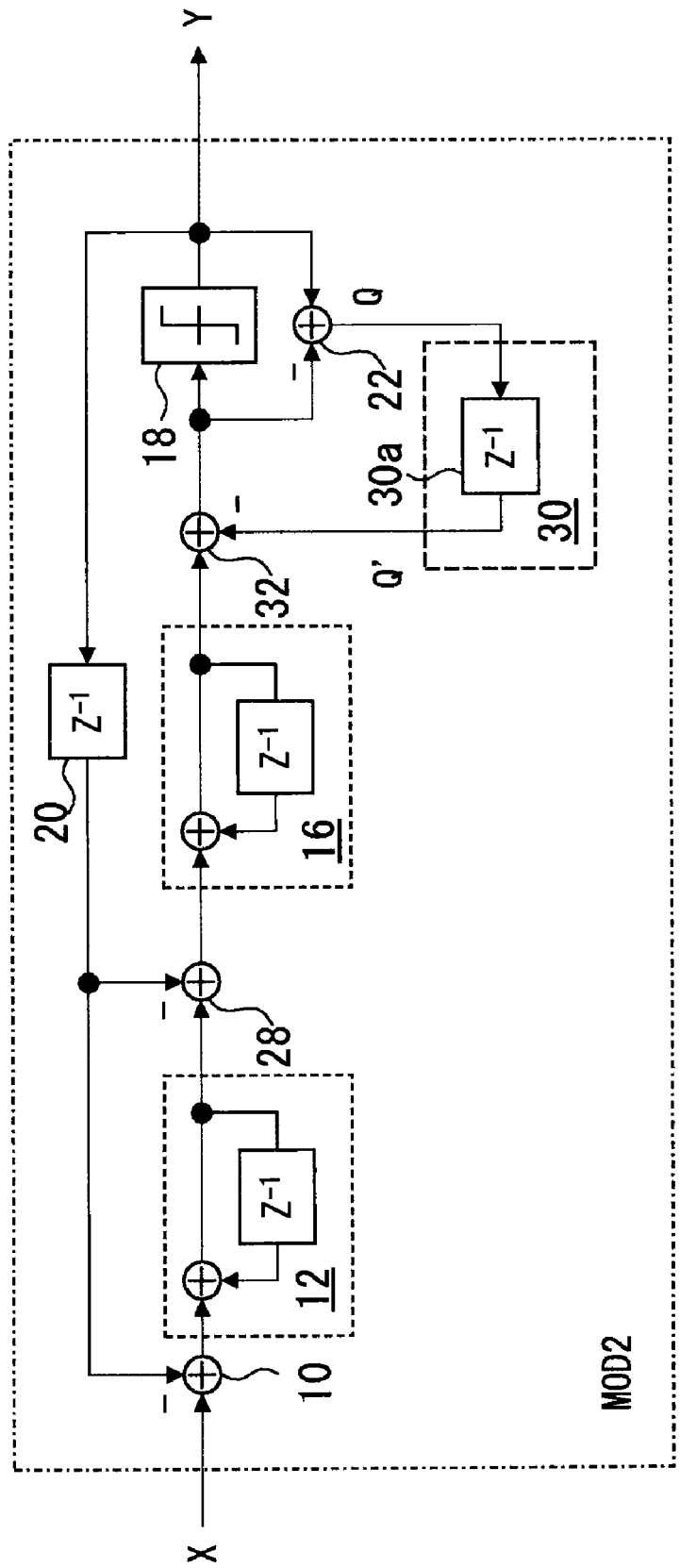
FIG. 8 illustrates a second embodiment.

FIG. 8 illustrates a second embodiment. In the ΔΣ modulation circuit illustrated in FIG. 8, a description of elements that are the same as the elements illustrated in FIG. 1 may be omitted or reduced. The ΔΣ modulation circuit MOD2 includes an adder 28 and a feedback circuit 30. The adder 28 and feedback circuit 30 illustrated in FIG. 8 may correspond to the adder 14 and feedback circuit 24 illustrated in FIG. 1. The feedback circuit 30 includes a delay device 30a. In the ΔΣ modulation circuit MOD2, an adder 32 is provided between an integrator 16 and a quantizer 18. The rest of the configuration is substantially the same as, or similar to, the configuration of the ΔΣ modulation circuit MOD1 illustrated in FIG. 1. The frequency characteristic and the time response simulation waveforms of the ΔΣ modulation circuit MOD2 illustrated in FIG. 8 are substantially the same as, or similar to, the frequency characteristic and time response simulation waveforms illustrated in FIGS. 2 and 3. The ΔΣ modulation circuit MOD2 may be mounted in the system SYS illustrated in FIG. 4.

The adder 28 receives an output of the integrator 12 and an output of a delay device 20, and outputs an operation result to the integrator 16. The adder 32 receives an output of the integrator 16 and an output of the feedback circuit 30, and outputs an operation result to the quantizer 18 and an adder 22. The feedback circuit 30 generates a feedback signal Q' from a quantized noise Q, and outputs it to the adder 32.

A signal transmission characteristic of the ΔΣ modulation circuit MOD2 illustrated in FIG. 8 is indicated in equation 3.

$$Y(z) = ((X(z) - Y(z)Z^{-1})/(1 - Z^{-1}) - Y(z)Z^{-1})/(1 - Z^{-1}) - QZ^{-1} + Q \quad 3$$

By solving equation 3, the previous equation 2 is obtained. The ΔΣ modulation circuit MOD2 illustrated in FIG. 8, in the same way as the ΔΣ modulation circuit MOD1 illustrated in FIG. 1, has a third-order shaping characteristic.

Aspects of the second embodiment provide substantially the same benefit as or a similar benefit to the first embodiment. Also, the size of the feedback circuit 30 of the second embodiment may be less than that of the feedback circuit 24 illustrated in FIG. 1. As the feedback circuit does not include a differentiator, power consumption may be reduced.

Figure 9:
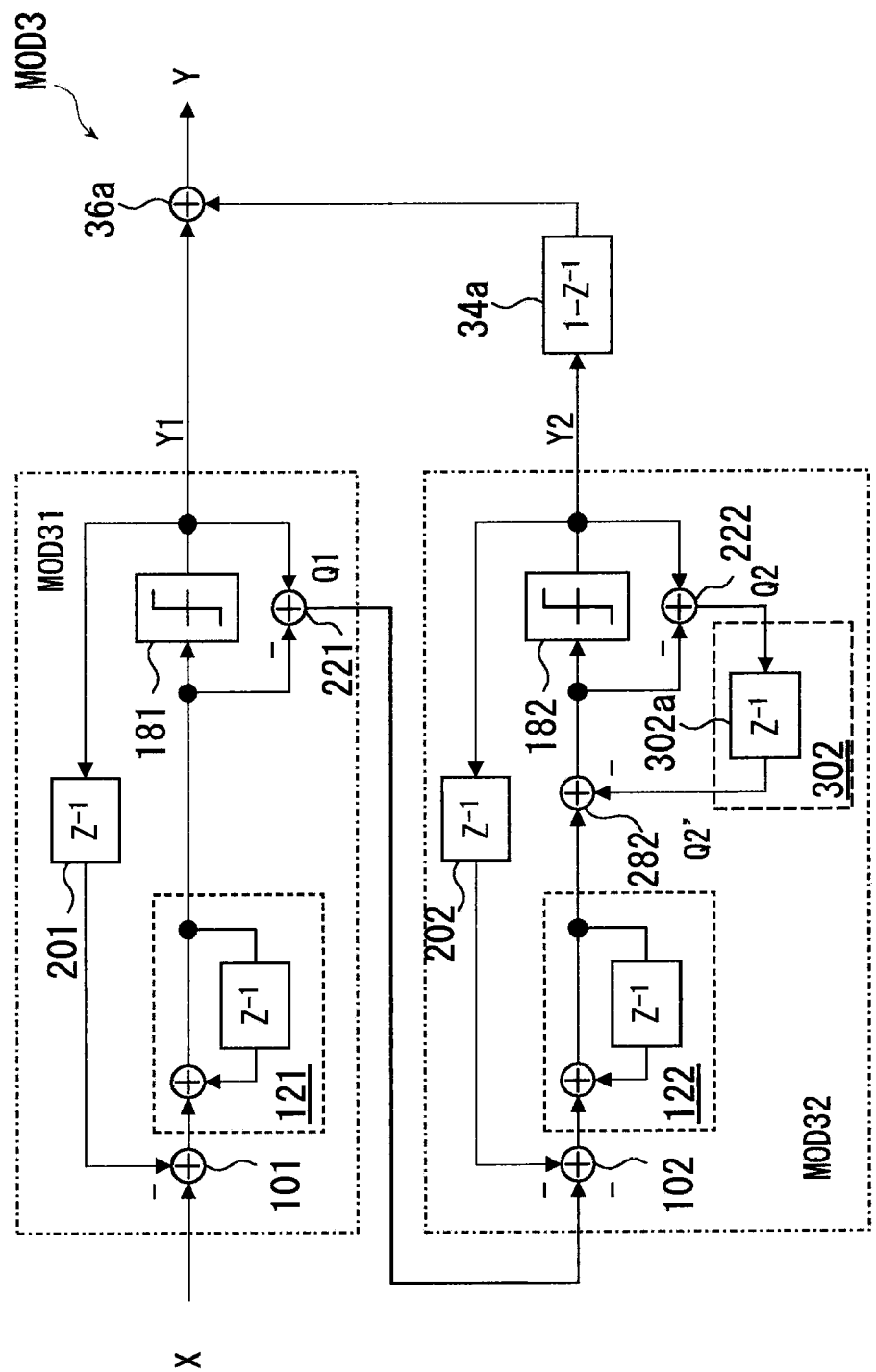
FIG. 9 illustrates a third embodiment.

FIG. 9 illustrates a third embodiment. In the ΔΣ modulation circuit MOD3 illustrated in FIG. 9, a description of components that are the same as those illustrated in FIG. 1 is omitted. The ΔΣ modulation circuit MOD3 employs a MASH (MultistAgenoiseSHaping) method. The ΔΣ modulation circuit MOD3 includes two ΔΣ modulators, MOD31 and MOD32, connected in cascade. It is acceptable that frequency characteristic and time response simulation waveforms of the ΔΣ modulation circuit MOD3 are essentially the same as, or similar to, the frequency characteristic and time response simulation waveforms illustrated in FIGS. 2 and 3. It is acceptable that the ΔΣ modulation circuit MOD3 is mounted in the system SYS illustrated in FIG. 4.

The ΔΣ modulator MOD31 includes an adder 101, integrator 121, and quantizer 181 coupled in series, and a delay device 201 and adder 221. An input signal X is input into the adder 101. An output signal Y1 is output from the quantizer 181. The delay device 201 receives the output signal Y1, and feeds it back to the adder 101. The adder 101 receives the input signal X and the output of the delay device 201, and outputs an operation result to the integrator 121. The adder 221 extracts a difference between an input and output of the quantizer 181 as a quantized noise Q1, and outputs it to an adder 102 of the ΔΣ modulator MOD32.

The ΔΣ modulator MOD32 includes an adder 102, integrator 122, adder 282, and quantizer 182 coupled in series, and a delay device 202, adder 222, and feedback circuit 302. An output signal Y2 is output from the quantizer 182. The delay device 202 receives the output signal Y2, and feeds it back to the adder 102. The adder 102 receives the quantized noise Q1 from the ΔΣ modulator MOD31 and the output of the delay device 202, and outputs an operation result to the integrator 122. The adder 282 receives an output of the integrator 122 and an output Q2' of the feedback circuit 302, and outputs an operation result to the quantizer 182 and adder 222. The adder 222 extracts a difference between an input and output of the quantizer 182 as a quantized noise Q2. The feedback circuit 302 includes a delay device 302a. The feedback circuit 302 generates a feedback signal Q2' from the quantized noise Q2, and outputs it to the adder 282.

With the MASH method, an output of a previous stage being coupled to an input of a subsequent stage, a quantization error occurring in the previous modulator is compensated for at a final stage. Therefore, the ΔΣ modulation circuit MOD5 includes a differentiator 34a, which receives the output signal Y2, and an adder 36a, which receives the output signal Y1 and an output of the differentiator 34a and outputs an operation result as an output signal Y.

Signal transmission characteristics of the ΔΣ modulation circuit MOD3 illustrated in FIG. 9 are indicated in equations 4, 5, and 6.

$$Y_1(z)=(X(z)-Y_1(z)Z^{-1})/(1-Z^{-1})+Q_1 \qquad 4$$

$$Y_2(z)=(-Q_1-Y_2(z)Z^{-1})/(1-Z^{-1})-Q_2Z^{-1}+Q_2 \qquad 5$$

$$Y(z)=Y_1(z)+Y_2(z)(1-Z^{-1}) \qquad 6$$

Equation 4 indicates the signal transmission characteristic of the ΔΣ modulator MOD31. Equation 5 indicates the signal transmission characteristic of the ΔΣ modulator MOD32. Equation 6 indicates the signal transmission characteristic of the ΔΣ modulation circuit MOD3 including the differentiator 34a and the adder 36a.

By solving equation 6, equation 7 is obtained.

$$Y(z)=X(z)+Q_2(1-Z^{-1})^3 \qquad 7$$

The ΔΣ modulation circuit MOD3 illustrated in FIG. 9 employs the MASH method and includes one integrator in each stage. The noise shaping characteristic at a general 2-stage MASH configuration indicates second-order. Equation 7 indicates that the ΔΣ modulation circuit MOD3 with 2-stage MASH configuration has a third-order noise shaping characteristic.

The third embodiment provides substantially the same benefit as the previous embodiments. In order to realize the MASH method third-order noise shaping characteristic by use of a general MASH configuration, one additional modulator coupled in cascade may be necessary. However, in the illustrated aspects of the embodiments, a small-sized ΔΣ modulation circuit with 2-stage MASH configuration having a third-order noise shaping characteristic is provided. The size of a semiconductor chip SC on which the ΔΣ modulation circuit MOD3 is mounted may be downscaled, and the cost of the system SYS may be reduced.

Figure 10:
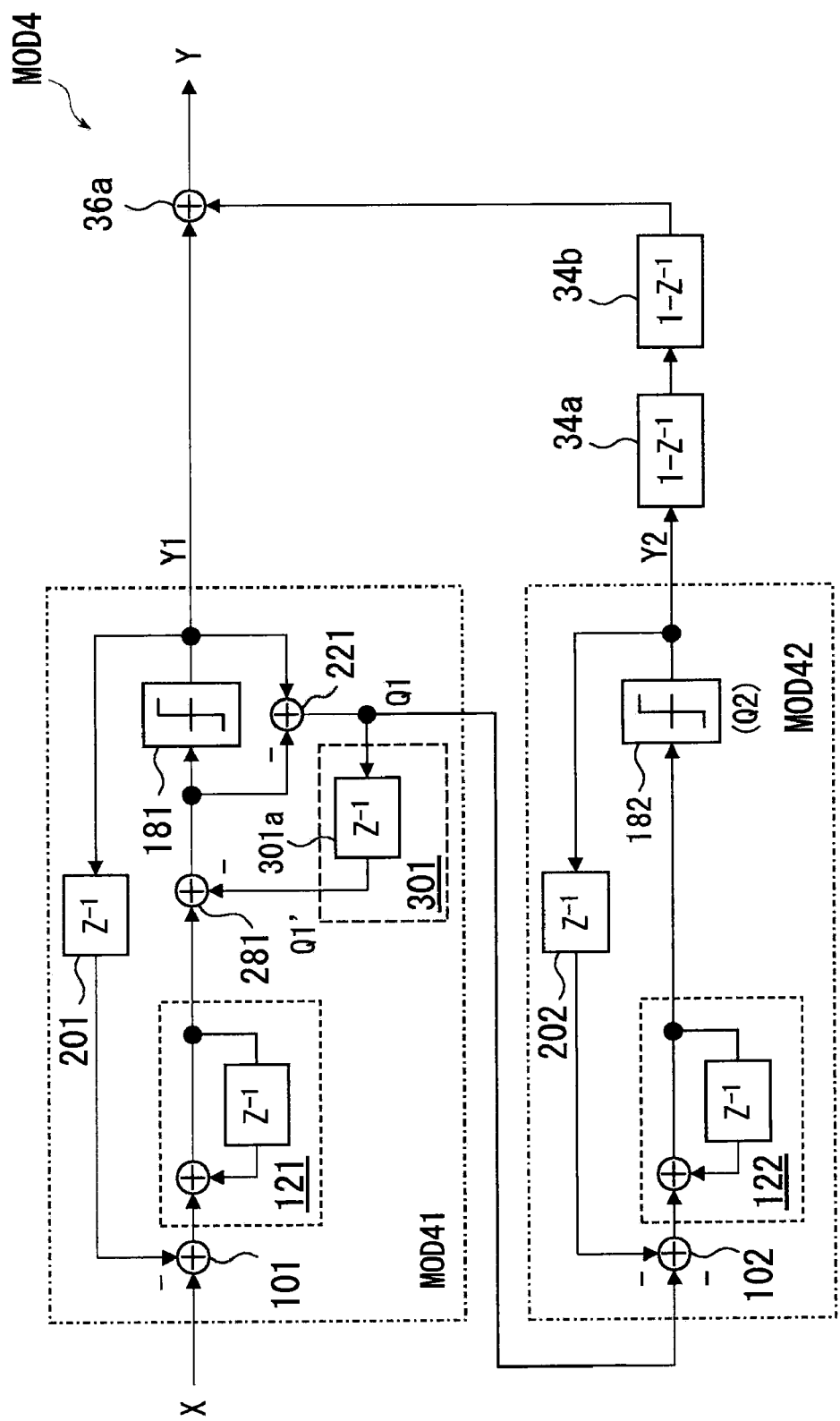
FIG. 10 illustrates a fourth embodiment.

FIG. 10 illustrates a fourth embodiment. A description of elements that are substantially the same as those in FIGS. 1 and 9 is omitted or reduced. The ΔΣ modulation circuit MOD4 employs the MASH method. The ΔΣ modulation circuit MOD4 includes two ΔΣ modulators, MOD41 and MOD42, coupled in cascade. Frequency characteristic and time response simulation waveforms of the ΔΣ modulation circuit MOD4 may be substantially the same as or similar to the frequency characteristic and time response simulation waveforms illustrated in FIGS. 2 and 3. The ΔΣ modulation circuit MOD4 may be mounted in the system SYS illustrated in FIG. 4.

In the ΔΣ modulation circuit MOD4, the ΔΣ modulators MOD31 and MOD32 illustrated in FIG. 9 may be interchanged. The ΔΣ modulator MOD41 may be substantially the same as or similar to the ΔΣ modulator MOD32. A feedback circuit 301 of the ΔΣ modulator MOD41 includes a delay device 301a. The ΔΣ modulator MOD42 may be substantially the same as a circuit wherein the adder 221 has been removed from the ΔΣ modulator MOD31. The ΔΣ modulation circuit MOD4, in order to compensate for a quantization error Q1, includes differentiators 34a and 34b coupled in series, which receive an output signal Y2, and an adder 36a, which receives an output signal Y1 and an output of the differentiator 34b and outputs an output signal Y.

Signal transmission characteristics of the ΔΣ modulation circuit MOD4 illustrated in FIG. 10 are indicated in equations 8, 9, and 10.

$$Y_1(z)=(X(z)-Y_1(z)Z^{-1})/(1-Z^{-1})-Q_1Z^{-1}+Q_1 \qquad 8$$

$$Y_2(z)=(-Q_1-Y_2(z)Z^{-1})/(1-Z^{-1})+Q_2 \qquad 9$$

$$Y(z)=Y_1(z)+Y_2(z)(1-Z^{-1})^2 \qquad 10$$

Equation 8 indicates the signal transmission characteristic of the ΔΣ modulator MOD41. Equation 9 indicates the signal transmission characteristic of the ΔΣ modulator MOD42. Equation 10 indicates the signal transmission characteristic of the ΔΣ modulation circuit MOD4 including the differentiators 34a and 34b, and the adder 36a.

By solving equation 10, the above-described equation 7 is obtained. The ΔΣ modulation circuit MOD4 illustrated in FIG. 10 has a third order shaping characteristic with two integrators. Aspects of the fourth embodiment provide substantially the same benefit as the previously described embodiments.

Figure 11:
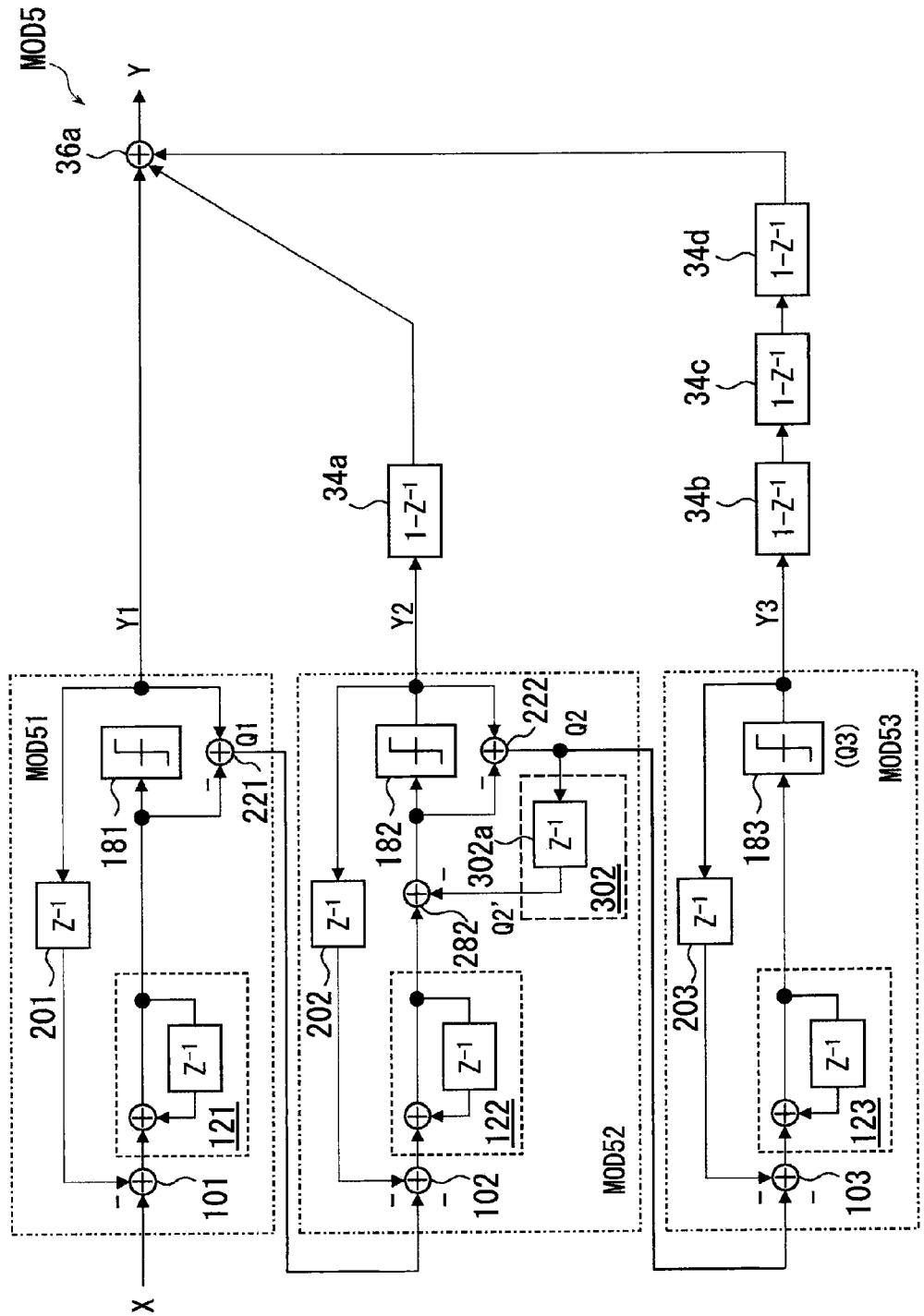
FIG. 11 illustrates a fifth embodiment.

FIG. 11 illustrates a fifth embodiment. A description of elements that are the same as those in FIGS. 1 and 9 is omitted or reduced. The ΔΣ modulation circuit MOD5 employs the MASH method. The ΔΣ modulation circuit includes three ΔΣ modulators, MOD51, MOD52, and MOD53, coupled in cascade. The ΔΣ modulation circuit MOD5 may be mounted in the system SYS illustrated in FIG. 4.

The ΔΣ modulators MOD51 and MOD52 may be substantially the same as or similar to the ΔΣ modulators MOD31 and MOD32 illustrated in FIG. 9. The ΔΣ modulator MOD53 may be substantially the same as or similar to the ΔΣ modulator MOD42 illustrated in FIG. 10. The ΔΣ modulation circuit MOD5, in order to compensate for quantization errors Q1 and Q2, includes differentiators 34a, 34b, 34c and 34d, and an adder 36a. FIG. 11 illustrates an aspect wherein a differentiator is disposed between an output of the ΔΣ modulator of each of a second stage and subsequent stages and the adder. The differentiator 34a receives an output signal Y2. The differentiators 34b, 34c, and 34d, being coupled in series, receive an output signal Y3 at the differentiator 34b. The adder 36a receives an output signal Y1, an output of the differentiator 34a, and an output of the differentiator 34d, and outputs an operation result as an output signal Y.

Signal transmission characteristics of the ΔΣ modulation circuit MOD5 illustrated in FIG. 11 are indicated in equations 11, 12, 13, and 14.

$$Y_1(z) = (X(z) - Y_1(z)Z^{-1})/(1-Z^{-1}) + Q_1 \quad 11$$

$$Y_2(z) = (-Q_1 - Y_2(z)Z^{-1})/(1-Z^{-1}) - Q_2 Z^{-1} + Q_2 \quad 12$$

$$Y_3(z) = (-Q_2 - Y_3(z)Z^{-1})/(1-Z^{-1}) + Q_3 \quad 13$$

$$Y(z) = Y_1(z) + Y_2(z)(1-Z^{-1}) + Y_3(z)(1-Z^{-1})^3 \quad 14$$

Equations 11, 12, and 13 indicate the signal transmission characteristics of the ΔΣ modulators MOD51, MOD52, and MOD53 respectively. Equation 14 indicates the signal transmission characteristic of the ΔΣ modulation circuit MOD5 including the differentiators 34a to 34d, and the adder 36a.

By solving equation 14, equation 15 is obtained.

$$Y(z) = X(z) + Q_3(1-Z^{-1})^4 \quad 15$$

The ΔΣ modulation circuit MOD5 illustrated in FIG. 11 has a fourth-order noise shaping characteristic with three integrators. Aspects of the fifth embodiment provide substantially the same benefit as the previously described embodiments.

Figure 12:
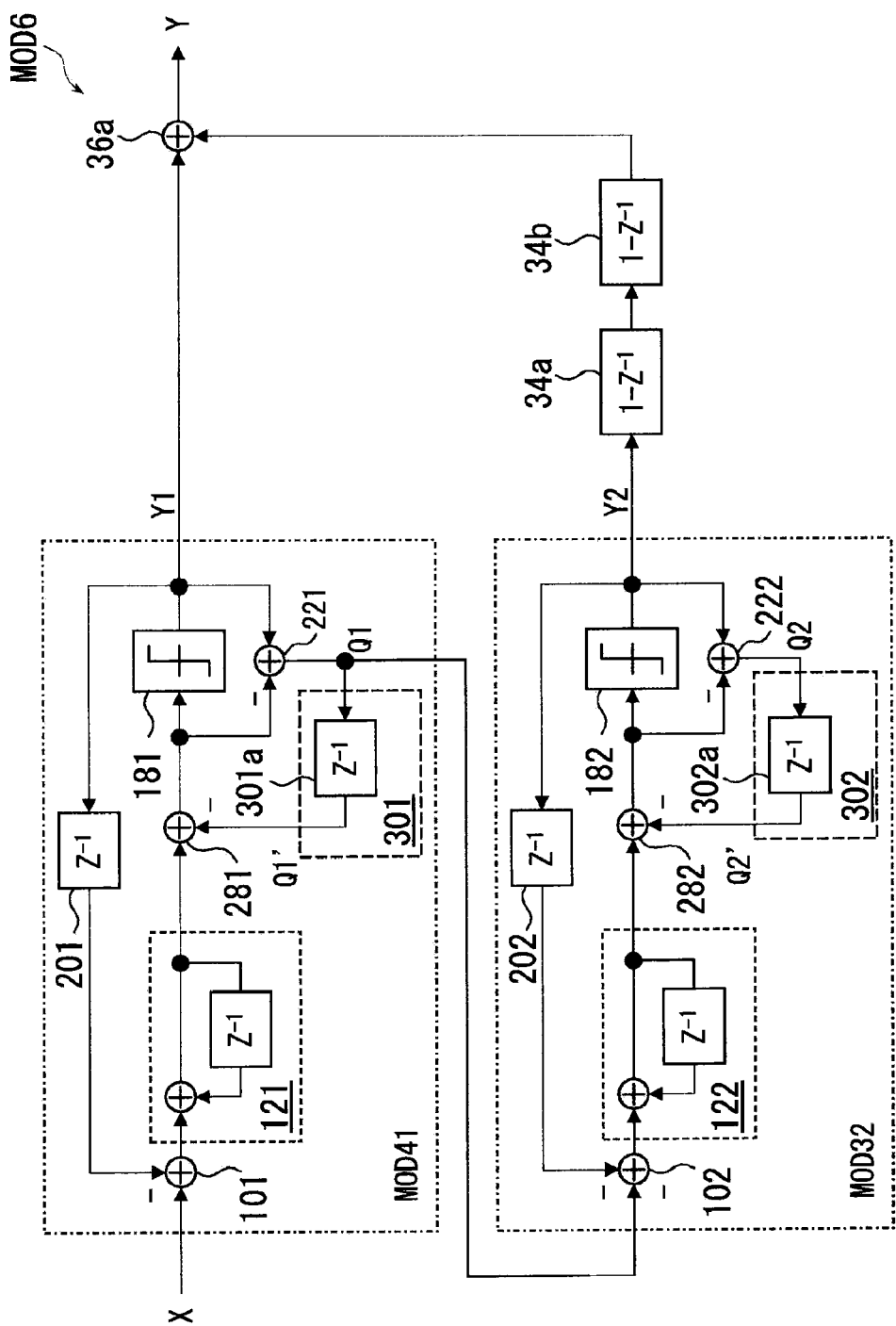
FIG. 12 illustrates a sixth embodiment.

FIG. 12 illustrates a sixth embodiment. A description of components that are the same as those in FIGS. 1 and 9 is omitted or reduced. The ΔΣ modulation circuit MOD6 employs the MASH method. The ΔΣ modulation circuit MOD6 includes two ΔΣ modulators, MOD41 and MOD32, coupled in cascade. The ΔΣ modulators MOD41 and MOD32 may be substantially the same as or similar to the ΔΣ modulators illustrated in FIGS. 10 and 9 respectively. The ΔΣ modulation circuit MOD6 may be mounted in the system SYS illustrated in FIG. 4.

The ΔΣ modulation circuit MOD6, in order to compensate for a quantization error Q1, includes differentiators 34a and 34b, coupled in series, which receive an output signal Y2, and an adder 36a, which receives an output signal Y1 and an output of the differentiator 34b, and outputs an operation result as an output signal Y.

Signal transmission characteristics of the ΔΣ modulation circuit MOD6 illustrated in FIG. 12 are indicated in the above-described equations 8, 5, and 10. Equations 8 and 5 indicate the signal transmission characteristics of the ΔΣ modulators MOD41 and MOD32 respectively. Equation 10 indicates the signal transmission characteristic of the ΔΣ modulation circuit MOD6 including the differentiators 34a and 34b, and the adder 36a.

By substituting equation 10 with equations 8 and 5, and solving them, equation 16 is obtained.

$$Y(z) = X(z) + Q_2(1-Z^{-1})^4 \quad 16$$

The ΔΣ modulation circuit MOD6 illustrated in FIG. 12 has a fourth order noise shaping characteristic with two integrators. Aspects of the sixth embodiment provide substantially the same benefit as the previous embodiments.

In the previous embodiments, the ΔΣ modulation circuit is provided inside the synthesizer FSYN of the transmission circuit TC, but it may be provided in a reception circuit.

Example embodiments in accordance with aspects of the present invention have now been described in accordance with the above advantages. It will be appreciated that these examples are merely illustrative of the invention. Many variations and modifications will be apparent to those skilled in the art.

What is claimed is:

1. A ΔΣ modulation circuit, comprising:
a first integrator and second integrator coupled in series;
a quantizer coupled to an output of the second integrator;
a delay device disposed in a feedback path from an output of the quantizer to an input of the first and second integrators;
an adder configured to generate a difference between an output and an input of the quantizer; and
a feedback circuit including a delay device configured to couple an output of the adder to an output of one of the first integrator and the second integrator,
wherein the output of the adder is coupled to the output of the second integrator, and the feedback circuit includes only the delay device.

2. A ΔΣ modulation circuit, comprising:
a plurality of ΔΣ modulators, each of which includes integrators and quantizers coupled in series, and delay devices disposed in feedback paths from an output of the quantizers to an input of the integrators and outputs a difference between an output and an input of a quantizer at a ΔΣ modulator previous stage to an input of a subsequent ΔΣ modulator stage;
an adder which adds the outputs of the ΔΣ modulators; and
at least one differentiator disposed between an output of the ΔΣ modulator of each of a second stage and subsequent stages and the adder,
wherein at least one of the ΔΣ modulators includes a feedback circuit including a delay device for feeding the difference back to an output of the at least one of the ΔΣ modulator.

3. The ΔΣ modulation circuit according to claim 2, wherein the feedback circuit includes only the delay device.

4. A system, comprising:
a quadrature modulator configured to quadrature-convert an analog signal and generates an output signal; and
a synthesizer configured to generate a clock CK for a modulation of the quadrature modulator and includes a ΔΣ modulation circuit; and
wherein the ΔΣ modulation circuit includes:
a first integrator and second integrator coupled in series;
a quantizer coupled to an output of the second integrator;

a delay device disposed in a feedback path from an output of the quantizer to an input of the first and second integrators;

an adder configured to generate a difference between an output and an input of the quantizer; and a feedback circuit including a delay device configured to couple an output of the adder to an output of one of the first integrator and the second integrator.

5. The system according to claim 4, wherein the output of the adder is coupled to the output of the first integrator, and the feedback circuit includes the delay device and a differentiator coupled in series.

6. The system according to claim 4, wherein the output of the adder is coupled to the output of the second integrator, and the feedback circuit includes only the delay device.

* * * * *